United States Patent [19]
Lewis et al.

[11] 4,158,240
[45] Jun. 12, 1979

[54] METHOD AND SYSTEM FOR DATA CONVERSION

[75] Inventors: James D. Lewis, Lexington, Ky.; John A. Lowy, Longmont, Colo.

[73] Assignee: International Business Machines Corporation, Armonk, N.Y.

[21] Appl. No.: 861,593

[22] Filed: Dec. 19, 1977

[51] Int. Cl.² .................. G11C 7/00; G11C 19/00
[52] U.S. Cl. ................................. 365/189; 365/183
[58] Field of Search ............... 365/183, 189, 230, 77; 364/200 MS File

[56] References Cited

U.S. PATENT DOCUMENTS

| | | | |
|---|---|---|---|
| 3,786,440 | 1/1974 | Toyen | 340/173 R |
| 3,889,245 | 6/1975 | Gosney | 365/183 |

Primary Examiner—Stuart N. Hecker
Attorney, Agent, or Firm—Frank C. Leach, Jr.

[57] ABSTRACT

A charge coupled device (CCD) serial memory has data read from or written into it at a sub-multiple rate of the data rate. The sub-multiple rate is determined by the number of interleaved blocks into which the CCD serial memory is divided.

28 Claims, 4 Drawing Figures

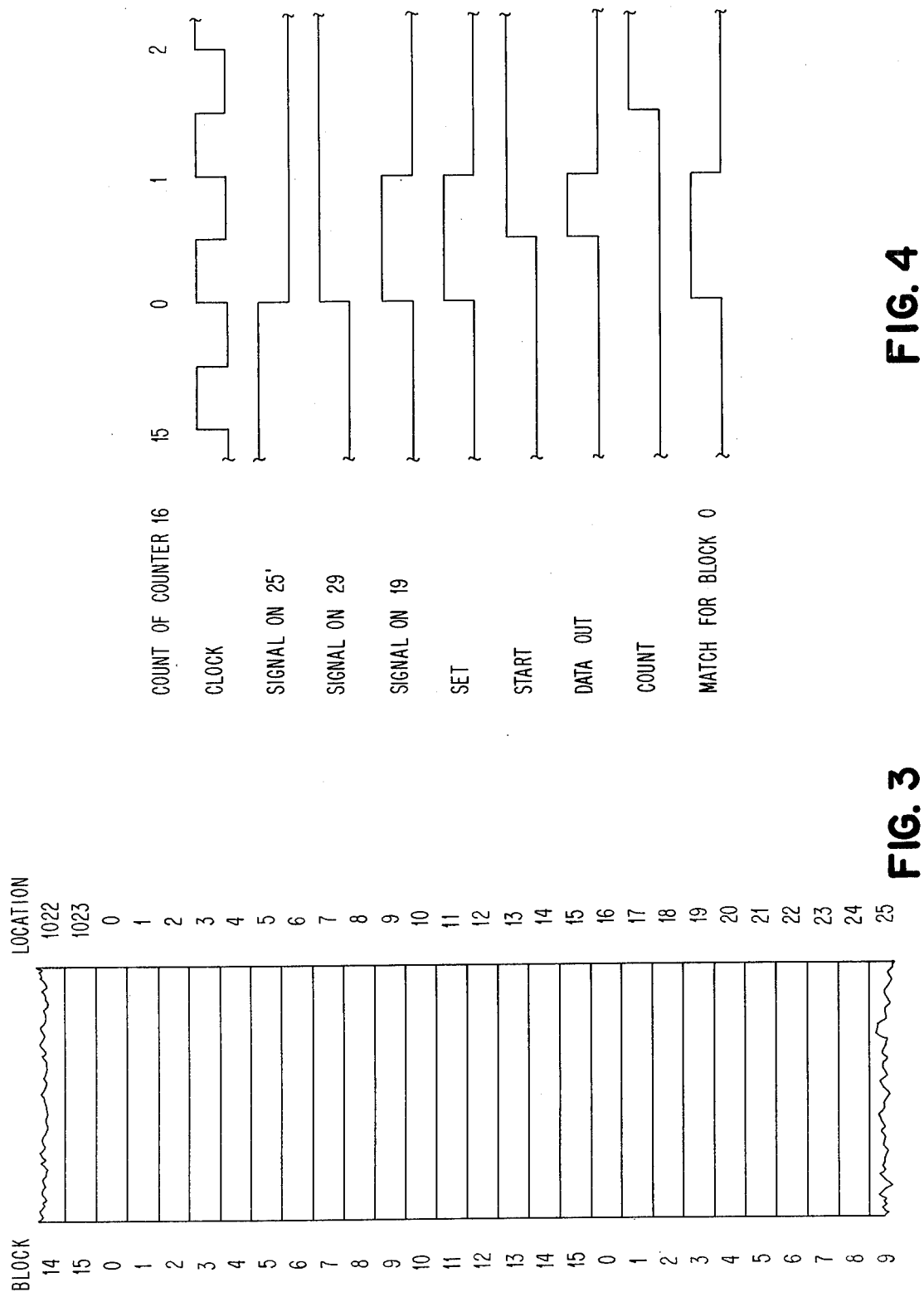

METHOD AND SYSTEM FOR DATA CONVERSION

In dynamic storage means such as a dynamic shift register, for example, the data rate at which the storage cells are accessed for reading or writing is fixed. Thus, when using a dynamic storage means, it has been necessary for the dynamic storage means to be designed so that its data rate is in accordance with the data system with which it is to be used.

An increase in the data rate of a dynamic storage means enables each storage cell to be smaller. Thus, a higher density of storage cells can be obtained in a given area with an increase in the data rate. This increase in the density of the storage cells reduces the cost of the memory since less space is required on a chip.

Therefore, to obtain economical memory size when using a dynamic storage means such as a dynamic shift register, for example, the data rate of the dynamic shift register has required a data system operating at a relatively high frequency. However, in some data systems such as those used with a microprocessor, for example, the system does not operate at a relatively high frequency.

Therefore, the desired economical use of a dynamic storage means having a relatively high data rate has not been previously compatible with the microprocessor system. This is because the microprocessor system operates at a relatively low frequency so as to require a relatively low data rate.

Accordingly, with a microprocessor system, the storage cell density of a dynamic storage means has to be rather low so as to result in requiring a relatively large amount of space on a chip. This has increased the cost so as to negate the economical effect of a dynamic shift register.

The present invention satisfactorily solves the foregoing problem through providing a dynamic storage means operating at a relatively high rate of frequency so as to obtain an economical memory size while reading data from or writing data into the dynamic storage means at a much lower frequency than the data rate. The present invention accomplishes this through accessing only one block of storage cell means, which comprises one or more storage cells, in each group of blocks of storage cell means during each complete scan of the dynamic storage means. This enables the data to be read from the dynamic storage means or the data to be written into the dynamic storage means at the rate of frequency at which the microprocessor system operates while still obtaining the economically desired high storage cell density.

The rate at which reading or writing occurs is a sub-multiple of the data rate and is dependent on the number of interleaved blocks of storage cell means in each group of blocks. For example, if there are sixteen interleaved blocks of storage cell means in each group so that sixty-four groups form a 1K memory, then sixty-four blocks of storage cell means with each being spaced sixteen blocks of storage cell means from the prior accessed block of storage cell means would be accessed during each complete scan.

After each complete scan, another block of the storage cell means of each group of sixteen blocks of storage cell means would be accessed so that another sixty-four blocks of storage cell means would be accessed during the next complete scan. Therefore, the sub-multiple rate would be one-sixteenth of the data rate of the dynamic storage means.

An object of this invention is to read data from and write data into a dynamic storage means at a rate slower than its scanning rate.

Another object of this invention is to read data from and write data into a dynamic storage means at a sub-multiple rate of its data rate.

A further object of this invention is to utilize a dynamic storage means with a microprocessor system having a lower rate than the scanning rate of the dynamic storage means.

The foregoing and other objects, features, and advantages of the invention will be apparent from the following more particular description of a preferred embodiment of the invention as illustrated in the accompanying drawings.

In the drawings:

FIG. 3 is a schematic diagram of a portion of one of the charge coupled devices forming the dynamic storage means of the present invention.

FIG. 4 is a timing diagram showing the relationship of various signals produced by the portion of the data conversion system in FIG. 2.

Figure 1:
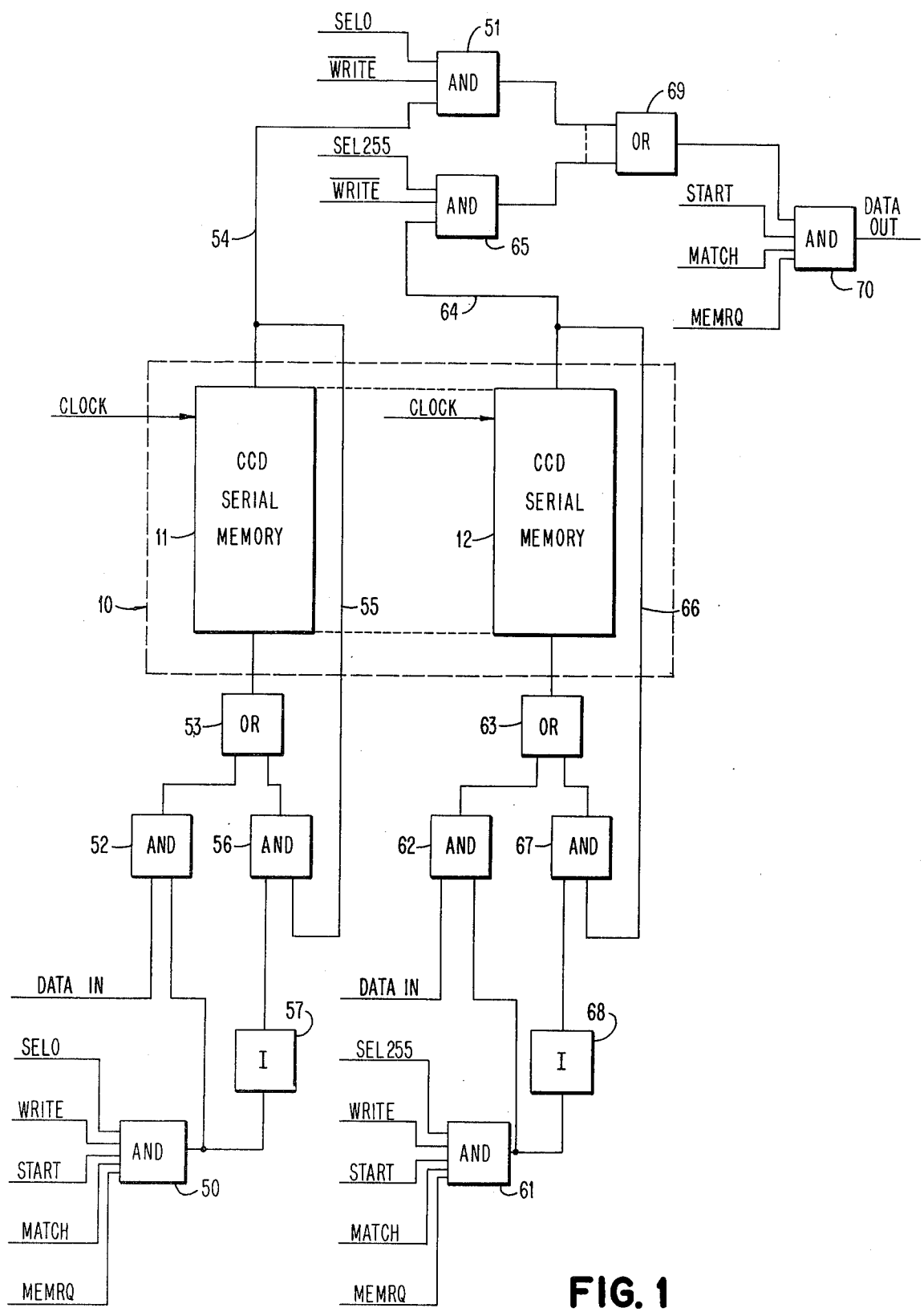
FIG. 1 is a schematic block diagram of a portion of the data conversion system of the present invention.

Referring to the drawings and particularly FIG. 1, there is shown a memory 10. The memory 10 comprises two hundred and fifty-six CCD serial memories, which are dynamic shift registers. A CCD serial memory 11 is the first of the two hundred and fifty-six CCD serial memories and a CCD serial memory 12 is the last of the two hundred and fifty-six CCD serial memories. The other two hundred and fifty-four CCD serial memories are not shown.

Each of the CCD serial memories (two shown at 11 and 12) of the memory 10 has 1,024 bytes with each byte having eight bits. Each of the bytes comprises a storage cell means. While each of the bytes preferably contains eight bits and each bit is a storage cell, it should be understood that each of the bytes could contain one bit or any number of bits.

As shown in FIG. 3, each of the CCD serial memories (two shown at 11 and 12 in FIG. 1) has the bytes divided into groups of sixteen interleaved blocks of storage cell means. Each of the sixteen blocks of each of the sixty-four groups is numbered from 0 to 15 with the block 0 initially occurring at location 0. Thus, as shown in FIG. 3, the block 0 of the first group occurs at location 0, and the block 0 of the second group occurs at location 16, for example. Therefore, the block 0 occurs sixty-four times throughout the CCD memory since there are sixty-four groups.

By dividing the CCD serial memory (two shown at 11 and 12 in FIG. 1) into groups of sixteen blocks, the data rate of each of the CCD serial memories (two shown at 11 and 12) of the memory 10 is one-sixteenth of the clock rate. Thus, the block 0 of each of the sixty-four groups will be accessed in sequence for either reading or writing during one scan of the CCD serial memory 11, for example. Then, during the next scan of the CCD serial memory 11, each of the blocks 1 of the sixty-four groups would be accessed for reading or writing. Thus, it would take sixteen complete scans of the CCD memory 11 to read all of the data stored therein or write all new data thereinto.

It is necessary to write the data into the CCD serial memory 11 at the same rate at which the data is read out. This insures that the data is read in sequence from the correct block of each group.

Figure 2:
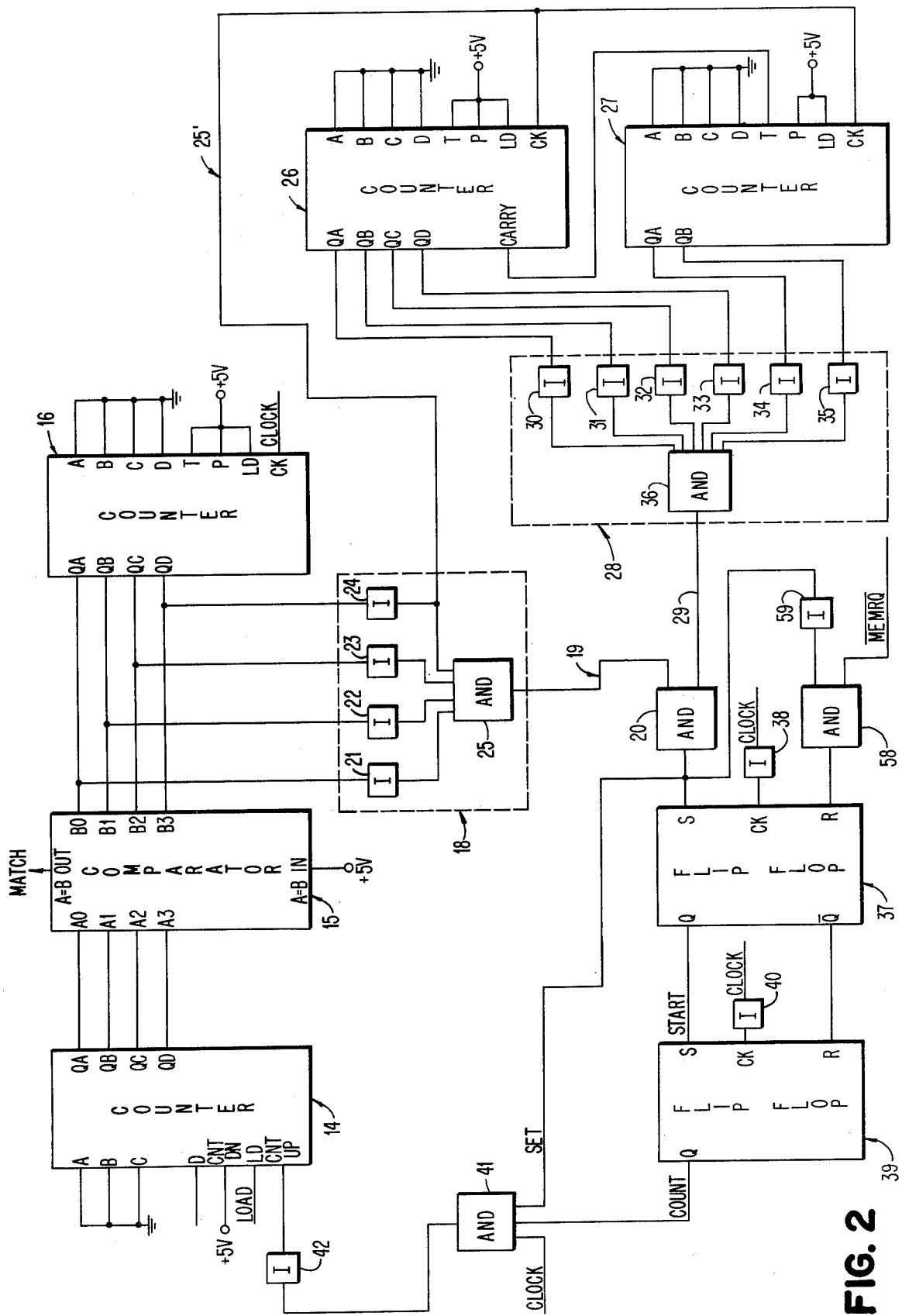
FIG. 2 is a schematic block diagram of another portion of the data conversion system of the present invention.

The circuit of FIG. 2 controls the specific block of one of the CCD serial memories (two shown at 11 and 12 in FIG. 1) of the memory 10 from which data is read or into which data is written. The circuit of FIG. 2 controls the sequence of accessing the blocks 0-15 so that only eight of the sixteen blocks are accessed in response to an address signal with accessing initially beginning at either the block 0 or the block 8 depending upon the state of an address signal to an input D of a counter 14. One suitable example of the counter 14 is a synchronous 4-bit up/down counter sold as model SN74193 by Texas Instruments.

When the address signal to the D input of the counter 14 is down, the blocks 0 are the initial blocks so that the blocks 0-7 are accessed. When the address signal to the input D of the counter 14 is up, the blocks 8 are the initial blocks from which data is read or into which data is written with the blocks 9 to 15 being the other accessed blocks in response to the high address signal.

The counter 14 has its A, B, and C inputs grounded and its CNT DN input connected to +5 volts. The counter 14 has each of its QA, QB, QC, and QD outputs connected to A0, A1, A2, and A3 inputs, respectively, of a comparator 15. One suitable example of the comparator 15 is a 4-bit magnitude comparator sold as model SN7485 by Texas Instruments.

The comparator 15 has its inputs B0, B1, B2, and B3 connected to outputs QA, QB, QC, and QD, respectively, of a four bit counter 16. One suitable example of the counter 16 is a synchronous 4-bit counter sold as model SN74161 by Texas Instruments. The counter 16 has its A, B, C, and D inputs grounded and each of its P, T, and LD inputs connected to +5 volts.

The counter 16 has its CK input receiving a CLOCK signal from an oscillator (not shown) to clock the counter 16 at a specific frequency. This is the frequency at which the CCD serial memories (two shown at 11 and 12 in FIG. 1) of the memory 10 are clocked. This frequency is the rate at which the CCD serial memories (two shown at 11 and 12) are recharged as well as being scanned.

The counter 16 (see FIG. 2) counts from 0 to 15 and then starts the count again at 0 in accordance with the CLOCK signals from the oscillator. Each positive going edge of the CLOCK signal at the CK input of the counter 16 causes the counter 16 to count one. Therefore, the counter 16 is counting at the same rate at which the blocks 0 (see FIG. 3) to 15 of each of the CCD memories (two shown at 11 and 12 in FIG. 1) are being accessed.

As previously mentioned, the counter 14 (see FIG. 2) is initially set at either the count of 0 or the count of 8 in accordance with the state of the address signal at the D input of the counter 14. This address signal at the D input is loaded into the counter 14 when a LOAD signal, which is supplied to LD input of the counter 14, goes low. This occurs prior to any accessing of the memory 10 (see FIG. 1).

The counter 16 (see FIG. 2) has each of its QA, QB, QC, and QD outputs also connected to a decoder 18. The decoder 18 has its output line 19 connected as one input to an AND gate 20.

The decoder 18 includes an inverter 21 connected to the QA output of the counter 16, an inverter 22 connected to the QB output of the counter 16, an inverter 23 connected to the QC output of the counter 16, and an inverter 24 connected to the QD output of the counter 16. The outputs of the inverters 21-24 are connected as inputs to an AND gate 25 of the decoder 18. Thus, the output of the AND gate 25 is high only when the counter 16 is at a count of zero. When this occurs, the output of each of the inverters 21-24 is high so that the AND gate 25 has a high output.

The output of the inverter 24 also is connected by a line 25' to CK input of each of counters 26 and 27. One suitable example of each of the counters 26 and 27 is the same as the counter 16.

Each of the counters 26 and 27 has its A, B, C, and D inputs grounded. Each of the counters 26 and 27 has each of its P and LD inputs connected to +5 volts. The counter 26 has its T input connected to +5 volts while the counter 27 has its T input connected to CARRY output of the counter 26.

The counter 27 counts one each time that the counter 26 counts sixteen. This is because each of the counters 26 and 27 can count only when the T, P, and LD inputs are high and the CARRY output of the counter 26 goes high only at the count of fifteen and goes down at the count of zero. Therefore, the counter 27 can only count once for each sixteen counts of the counter 26.

A rising edge of a high signal arrives at the CK input of each of the counters 26 and 27 each time that the count of the counter 16 goes from fifteen to zero since this is when the QD output of the counter 16 does down to cause the output of the inverter 24 to go up. Thus, in response to the positive going edge of the high signal from the inverter 24, the counter 26 counts one each time that sixteen of the blocks have been scanned at the rate of the CLOCK signals from the oscillator. This is when the data for one of the blocks has been read or written.

The counter 27 counts one each time that the counter 26 has counted sixteen. That is, when the counter 26 is at a count of fifteen, the counter 27 counts one upon receiving the rising edge of a high signal from the inverter 24. Accordingly, the counter 26 counts one each time that one of the groups of sixteen blocks has been accessed while the counter 27 counts one each time that sixteen groups of sixteen blocks have been accessed.

Therefore, QA, QB, QC, and QD outputs of the counter 26 and QA and QB outputs of the counter 27 will all be at zero again after counting the sixty-four times that data is read from or written into one of the CCD serial memories (two shown at 11 and 12 in FIG. 1) of the memory 10. This is when all of the data for all of the blocks 0 (see FIG. 3), for example, has been read or written.

The output of the counters 26 and 27 (see FIG. 2) are connected to a decoder 28, which has its output line 29 connected as the other input to the AND gate 20. The output of the decoder 29 is high only when both of the counters 26 and 27 are at a count of zero. Thus, the AND gate 20 provides a high only when both the decoder 18 and the decoder 28 are supplying high signals to indicate that each of the counters 16, 26, and 27 is at a count of zero. This occurs only once during every ten hundred and twenty-four of the CLOCK signals from the oscillator and is when a scan of the entire CCD serial memory (two shown at 11 and 12 in FIG. 1) has been completed.

The counter 26 has its QA, QB, QC, and QC inputs connected to inverters 30, 31, 32, and 33, respectively, of the decoder 28. The counter 27 has its QA and QB inputs connected to inverters 34 and 35, respectively, of the decoder 28.

The outputs of the inverters 30-35 are connected to an AND gate 36 of the decoder 28. Thus, the AND gate 36 has high inputs from all of the inverters 30-35 only when each of the counters 26 and 27 is at a count of zero. Therefore, the AND gate 36 provides a high on the output line 29 of the decoder 28 only when each of the counters 26 and 27 is at the count of zero.

The AND gate 20 produces a SET signal as its output. As shown in the timing diagram of FIG. 4, the SET signal goes up only when the signals on the lines 19 and 29 are up and stays up only as long as the signal on the lines 19 and 29 are high. The SET signal is up only for the period of time that the output line 19 of the decoder 18 is high when the signal on the output line 29 of the decoder 28 is high.

The SET signal is supplied to S input of a set/reset flip-flop 37. The flip-flop 37 has its CK input receiving the output of an inverter 38, which has the CLOCK signal from the OSCILLATOR as its input. Thus, the negative going edge of the CLOCK signal transfers the signal at the S input of the flip-flop 37 to its Q output. Therefore, as shown in the timing diagram of FIG. 4, a START signal at the Q output of the flip-flop 37 goes high one-half cycle of the oscillator after the SET signal goes up.

The START signal is supplied to S input of a set/reset flip-flop 39. The flip-flop 39 has its CK input receiving the output of an inverter 40, which has the CLOCK signal from the oscillator as its input. Thus, the flip-flop 39 has a COUNT signal at its Q output go high one cycle of the oscillator after the START signal from the Q output of the flip-flop 37 has gone high as shown in the timing diagram of FIG. 4.

The COUNT signal from the Q output of the flip-flop 39 is supplied as one input to an AND gate 41. The AND gate 41 also receives the CLOCK signal from the oscillator as another input. A third input to the AND gate 41 is the SET signal from the output of the AND gate 20.

When the COUNT signal from the Q output of the flip-flop 39 goes high, the SET signal from the output of the AND gate 20 is already low. This is because the Q output of the flip-flop 39 goes up on the negative going edge of the CLOCK signal, which causes the count of the counter 16 to advance from zero to one. When the counter 16 goes to the count of one, the output of the decoder 18 goes low so that the AND gate 20 does not have two high inputs whereby the SET signal at the output of the AND gate 20 goes down. Therefore, the AND gate 41 does not have three high inputs at this time.

The output of the AND gate 20 does not to high again until each of the counters 16, 26, and 27 is at a count of zero. This occurs only after ten hundred and twenty-four of the CLOCK signals have been produced by the oscillator. Thus, the CCD serial memory (two shown at 11 and 12 in FIG. 1) will have had one complete scan before the SET signal from the output of the AND gate 20 (see FIG. 2) goes high again.

Thus, the output of the AND gate 41 is down from the start of operation until there has been one complete scan of the CCD serial memory (two shown at 11 and 12 in FIG. 1). At this time, the output of the AND gate 41 (see FIG. 2) goes high.

The output of the AND gate 41 is connected to the input of an inverter 42, which has its output connected to CNT UP input of the counter 14. When the output of the AND gate 41 goes high, the output of the inverter 42 goes low, and this does not affect the output of the counter 14. However, when the output of the AND gate 41 goes low, the output of the inverter 42 goes high, and this positive going signal to the CNT UP input of the counter 14 advances the count of the counter 14 by one.

If the counter 14 was initially set to the count of zero by the address signal at the D input of the counter 14 being low, then the counter 14 advances to the count of one. If the counter 14 was set to the count of eight by a high being supplied to the D input of the counter 14, then the counter 14 advances to the count of nine the first time that the output of the AND gate 41 goes low after being high.

The output of the AND gate 41 goes high every ten hundred and twenty-four cycles of the oscillator. Thus, the count of the counter 14 increases one for each complete scan of the CCD serial memory (two shown at 11 and 12 in FIG. 1) of the memory 10.

This change in the count of the counter 14 (see FIG. 2) always occurs in response to each of the counters 16, 26, and 27 going to zero after the COUNT signal at the Q output of the flip-flop 39 has gone up. Thus, the counter 14 counts one after every ten hundred and twenty-four cycles of the oscillator producing the CLOCK signals.

The comparator 15 produces a MATCH signal, which goes high each time that the counters 14 and 16 are producing the same output. With the counter 14 being changed by a count of one for every ten hundred and twenty-four CLOCK signals, the comparator 15 produces sixty-four high MATCH signals during each ten hundred and twenty-four CLOCK signals.

If the counter 14 is initially set at the count of zero, for example, then the comparator 15 produces a high MATCH signal each time that the counter 16 is at the count of zero. This high MATCH signal at the count of zero is used to access one of the sixty-four blocks 0 (see FIG. 3) in one of the CCD serial memories (two shown at 11 and 12 in FIG. 1). Thus, the sixty-four high MATCH signals result in all sixty-four of the blocks 0 (see FIG. 3) being accessed during one complete scanning cycle of the CCD serial memory (two shown at 11 and 12 in FIG. 1).

When the counter 14 (see FIG. 2) is advanced from the count of zero to the count of one, the MATCH signal from the comparator 15 goes high each time that the counter 16 is at the count of one. This results in all sixty-four of the blocks 1 (see FIG. 3) being accessed during one complete scanning cycle. This is repeated for each of the blocks 0 to 7 when the counter 14 (see FIG. 2) is initially set at the count of 0 and for each of the blocks 8 (see FIG. 3) to 15 when the counter 14 (see FIG. 2) is initially set at the count of eight.

The CCD serial memories (two shown at 11 and 12 in FIG. 1) of the memory 10 from which data is to be read or into which data is to be written is selected in accordance with the output of an address decoder (not shown). The address decoder decodes an eight bit input address into two hundred and fifty-six outputs from SEL0 to SEL255.

When the SEL0 signal is high, the CCD serial memory 11 is having data read therefrom or data written thereinto. When the SEL255 signal from the address decoder is high, the CCD serial memory 12 is having data read from it or data written into it. The other two hundred and fifty-four signals from the address decoder are utilized to select the other two hundred and fifty-four CCD serial memories of the memory 10.

The SEL0 signal is supplied as one input to an AND gate 50. The SEL0 signal also is supplied as one input to an AND gate 51.

The AND gate 50 has a MEMRQ signal, the START signal, the MATCH signal, and a WRITE signal as its other inputs. All of the inputs to the AND gate 50 must be high for the output of the AND gate 50 to be high.

The MEMRQ signal is high whenever access to the memory 10 is desired. The MEMRQ signal must not go up until the counter 14 (see FIG. 2) has been loaded since the counter 14 must be loaded prior to any accessing of the memory 10 (see FIG. 1).

As previously mentioned, the START signal at the Q output of the flip-flop 37 (see FIG. 2) goes high one-half cycle of the oscillator after the SET signal from the output of the AND gate 20 has gone up. The START signal remains high as long as the MEMRQ signal is up.

The MATCH signal is generated by the comparator 15 and goes high once every sixteen times that the CLOCK signal goes up. Thus, the MATCH signal, as previously mentioned, determines which of the blocks 0-15 (see FIG. 3) in the CCD serial memory 11 (see FIG. 1) is accessed for writing when the SEL0 signal is high.

The WRITE signal is high whenever data is to be written into one of the CCD serial memories (two shown at 11 and 12) of the memory 10. Thus, when the WRITE signal is up and the SEL0 signal goes up with the START and MEMRQ signals already being up, the MATCH signal controls when the output of the AND gate 50 is high.

The output of the AND gate 50 is supplied as one input to an AND gate 52. The AND gate 52 receives a DATA IN signal as its other input from the computer.

The output of the AND gate 52 is one input to an OR gate 53, which has its output connected to the CCD serial memory 11. Thus, when the output of the AND gate 52 is high, the DATA IN signal is supplied through the AND gate 52 and the OR gate 53 to the CCD serial memory 11.

The CCD serial memory 11 has its output line 54 connected as one input to the AND gate 51 and through a recirculating line 55 as one input to an AND gate 56. The AND gate 56 has the output of an inverter 57 as its other input.

The inverter 57 is connected to the output of the AND gate 50 so that the output of the inverter 57 is always the opposite of the output of the AND gate 50. Thus, when the AND gate 50 has a high as its output, the output of the inverter 57 is low to inhibit the AND gate 56 from recirculating the output of the CCD serial memory 11 to its input through the OR gate 53, which has the output of the AND gate 56 as its other input.

Writing of data into the correct block in the CCD serial memory 11 is controlled by the MATCH and CLOCK signals. For example, if the MATCH signal goes up when the counter 16 (see FIG. 2) is at a count of zero, one of the blocks 0 (see FIG. 3) is supplying its output over the output line 54 (see FIG. 1) and the recirculating line 55 at this time. Because the MATCH signal has gone up, the DATA IN signal is supplied through the AND gate 52 and the OR gate 53 to the CCD serial memory 11 where it is latched. On the rising edge of the next CLOCK signal, the block 0 (see FIG. 3) is shifted so as to be disposed to receive the DATA IN signal whereby the DATA IN signal is written in the block 0. At this time, one of the blocks 1 in the CCD serial memory 11 (see FIG. 1) is shifted to provide its output over the output line 54 of the CCD serial memory 11.

Thus, the written data is supplied to the CCD serial memory 11 and latched for writing into the block 0 (see FIG. 3) when the MATCH signal has gone up. However, it is not written into the block 0 until the rising edge of the next CLOCK signal occurs since this also causes the block 0 to be advanced to the position in which it can receive the latched data.

With the MATCH signal occurring once for every sixteen blocks and occurring when the counter 16 (see FIG. 2) is at a count of zero, data is written into each of the blocks 0 (see FIG. 3) during a first complete scan of the CCD serial memory 11 (see FIG. 1). During each of the succeeding scans, data is written into the next of the blocks 0-7 (see FIG. 3) in each of the groups. That is, each of the blocks 1 has data written into it during the second complete scan of the CCD serial memory 11 (see FIG. 1).

After completing writing of data into the blocks 0-7 (see FIG. 3), for example, of the CCD serial memory 11 (see FIG. 1), the computer causes the MEMRQ signal to go down and $\overline{\text{MEMRQ}}$ signal to go up. This is necessary to stop further counting by the counter 14 (see FIG. 2).

The $\overline{\text{MEMRQ}}$ signal, which is inverse to the MEMRQ signal, is one of two inputs to an AND gate 58, which has its output connected to R input of the flip-flop 37. The other input to the AND gate 58 is the output of an inverter 59, which receives the SET signal from the output of the AND gate 20 as its input. Since the SET signal goes up once for every ten hundred and twenty-four of the CLOCK signals when each of the counters 16, 26, and 27 is at a count of zero, the AND gate 58 has a high as its output whenever the $\overline{\text{MEMRQ}}$ signal is high and any of the counters 16, 26, and 27 is not at a count of zero.

When accessing of the blocks 0-7 (see FIG. 3) of the CCD serial memory 11 (see FIG. 1), for example, is completed, the computer causes the $\overline{\text{MEMRQ}}$ signal to go high so that a high occurs at the R inputs of the flip-flop 37 (see FIG. 2) when any of the counters 16, 26, and 27 is not at a count of zero (It is only necessary that one of the counters 16, 26, and 27 not be at a count of zero.). The high at the R input of the flip-flop 37 is transferred to its $\overline{\text{Q}}$ output when the CLOCK signal next goes low since the inverter 38 inverts this to a positive going signal at the CK input of the flip-flop 37.

The $\overline{\text{Q}}$ output of the flip-flop 37 is connected to R input of the flip-flop 39. Thus, one CLOCK cycle after the START signal goes down, the Q output of the flip-flop 39 goes down. This prevents any further signals to the CNT up input of the counter 14 to cause its count to change.

If it is desired to next write in the blocks 8-15 (see FIG. 3) of the CCD serial memory 11 (see FIG. 1), then a high is supplied to the D input of the counter 14 (see FIG. 2) to load the counter 14 to a count of eight when the LOAD signal to the LD input goes down. Then, it again is necessary for the computer to cause the MEMRQ signal to go high to access the memory 10 (see FIG. 1).

The SET signal, the START signal, and the COUNT signal go high again in the same manner as previously described. Thus, the counter 14 (see FIG. 2) is not advanced to the count of nine until the counter 16 has received ten hundred and twenty-four of the CLOCK signals at its CK input after each of the counters 16, 26, and 27 is at a count of zero.

When writing into the blocks 8–15 (see FIG. 3) of the CCD serial memory 11 (see FIG. 1) is completed, the computer again causes the $\overline{\text{MEMRQ}}$ signal to go up and the MEMRQ signal to go down. This causes the counter 14 (see FIG. 2) to cease counting as previously explained.

Writing in any of the other CCD serial memories (two shown at 11 and 12 in FIG. 1) of the memory 10 could next occur. Thus, any order of access of the CCD serial memories (two shown at 11 and 12) of the memory 10 may be utilized as desired. Likewise, either the blocks 0–7 (see FIG. 3) or the blocks 8–15 can have data written thereinto during any time that the counter 14 (see FIG. 2) has the correct count set therein.

The CCD serial memory 12 (see FIG. 1) is accessed by the SEL255 signal from the address decoder going high. This is one of five inputs to an AND gate 61. The AND gate 61 has the same inputs as the AND gate 50 except that the AND gate 61 is receiving the SEL255 signal rather than the SEL0 signal as its fifth input. Thus, the AND gate 61 has its output go high in accordance with the MATCH signals in the same manner as the AND gate 50.

The AND gate 61 is connected to an AND gate 62 in the same manner as the AND gate 50 is connected to the AND gate 52. The AND gate 62 has the DATA IN signal as its other input, and the DATA IN signal is supplied through an OR gate 63 to the CCD serial memory 12 in the same manner as described for supplying the DATA IN signal to the CCD serial memory 11.

The CCD serial memory 12 has its output line 64 connected as one input to an AND gate 65 and through a recirculating line 66 as one input to an AND gate 67. The AND gate 67 is inhibited by the output of an inverter 68 whenever the AND gate 61 has a high to cause data to be written into the CCD serial memory 12 through the DATA IN signal being supplied to the AND gate 62.

The AND gate 51 has a $\overline{\text{WRITE}}$ signal as its other input. The $\overline{\text{WRITE}}$ signal is the inverse of the WRITE signal. Thus, only one of the WRITE and $\overline{\text{WRITE}}$ signals can be up at any time.

The $\overline{\text{WRITE}}$ signal is up whenever it is desired to read information from one of the CCD serial memories (two shown at 11 and 12) of the memory 10. If the SEL0 signal is up and the $\overline{\text{WRITE}}$ signal is up, then the data is to be read from the CCD serial memory 11.

All of the data from the CCD serial memory 11 is sequentially clocked therefrom to the output line 54 by the rising edge of each of the CLOCK signals supplied to the CCD serial memory 11. Each of the output signals from the CCD serial memory 11 is supplied over the lines 54 and 55 to the AND gate 56. Since the output of the AND gate 50 is always down at this time because the WRITE signal is low, the output of the inverter 57 is always high. Therefore, any high from the output of the CCD serial memory 11 is recirculated by the lines 54 and 55, the AND gate 56, and the OR gate 53 to the same block from which it is taken in the well-known manner of operation of a shift register. Accordingly, the data on the recirculating line 55 is latched in the CCD serial memory 11 until the next rising edge of the CLOCK signal when it is clocked into the same block from which it was taken.

Thus, if the output from the CCD serial memory 11 on the line 54 is a logical one, then a logical one will be returned to the CCD serial memory 11. If the output on the line 54 of the CCD serial memory 11 is a logical zero, then a logical zero will be returned to the CCD serial memory 11 because the output of the AND gate 56 will be low. Therefore, the output of the AND gate 56 is always dependent on the input from the recirculating line 55 whenever the output of the AND gate 50 is low.

The output of the AND gate 51 is supplied as one input to an OR gate 69. The OR gate 69 receives the output of the AND gate 65 and the output of an AND gate of each of the other two hundred and fifty-four CCD serial memories (not shown) of the memory 10 as its other two hundred and fifty-five inputs.

The AND gate 65 has the $\overline{\text{WRITE}}$ signal, the SEL255 signal, and the output of the CCD serial memory 12 as its inputs. All of the other AND gates, which are connected to the OR gate 69, have the $\overline{\text{WRITE}}$ signal as one input. Another input is the address signal from the address decoder for the specific CCD serial memory. The third input to each of the other two hundred and fifty-four AND gates, which are connected to the OR gate 69, is the output of the specific CCD serial memory.

Accordingly, only one of the two hundred and fifty-six AND gates (two shown at 51 and 65) connected to the OR gate 69 has a high during any time that data is being read. This is because only one of the SEL0 to SEL255 signals from the address decoder will be high at any time.

When the SEL0 signal is high, for example, the AND gate 51 transmits the output of the CCD serial memory 11 as the input to the OR gate 69 for each of the ten hundred and twenty-four blocks in the CCD serial memory 11. The output of the OR gate 69 is one of four inputs to an AND gate 70. The other inputs to the AND gate 70 are the START, MATCH, and MEMRQ signals. Thus, the MATCH signal controls the particular block of each group of sixteen blocks of data from the CCD serial memory 11 that is supplied as a DATA OUT signal on the output of the AND gate 70.

Accordingly, only one of the blocks of the blocks 0–15 (see FIG. 3) is accessed during each sixteen of the CLOCK signals supplied to the CCD serial memory 11 (see FIG. 1). The data from each of the other fifteen blocks of the blocks 0–15 (see FIG. 3) is not passed through the AND gate 70 (see FIG. 1) because the MATCH signal is low. The MATCH signal from the comparator 15 (see FIG. 2) goes high only each time that the output of the counter 16, which is always counting from 0 to 15 in accordance with the blocks 0–15 (see FIG. 3), is the same as that set by the counter 14 (see FIG. 2), which changes its output by a count of one after each ten hundred and twenty-four CLOCK signals from the oscillator.

Only the blocks 0–7 (see FIG. 3) or 8–15 of the CCD serial memory 11 (see FIG. 1) can supply its data through the AND gate 70 as the DATA OUT signals when the SEL0 signal is high. If the blocks 0–7 (see FIG. 3) of the CCD serial memory 11 (see FIG. 1) have been supplying the DATA OUT signals, the computer causes the $\overline{\text{MEMRQ}}$ signal to go high at the time that each of the counters 16 (see FIG. 2), 26, and 27 is at a count of zero after the counter 14 has advanced to the count of seven. When the $\overline{\text{MEMRQ}}$ signal goes high, the START and COUNT signals go down as previously explained. Thus, even though the counter 14 advances to the count of eight when the CLOCK signal goes down after having gone up at the time that each of the counters 16, 26, and 27 went to zero, the MEMRQ signal has gone down before the counter 16 reaches the count of eight to cause a high MATCH signal to appear.

Then, the counter 14 is loaded to the count of eight if the blocks 8-15 (see FIG. 3) of the CCD serial memory 11 (see FIG. 1) or the blocks 8-15 (see FIG. 3) of any of the other CCD serial memories of the memory 10 (see FIG. 1) are to supply the next DATA OUT signals. If the blocks 8-15 (see FIG. 3) of the CCD serial memory 11 (see FIG. 1) are to supply the DATA OUT signals, then there is no change in the output signal from the address decoder so that the SEL0 signal remains up. However, if another of the CCD serial memories is to have its blocks 8-15 (see FIG. 3) supply the next DATA OUT signals, then the eight bit input to the address decoder must be changed to supply the correct address signal. Thus, for example, if the blocks 8-15 (see FIG. 3) of the CCD serial memory 12 (see FIG. 1) were to be next read, the SEL255 signal from the address decoder would be high.

If the blocks 8-15 (see FIG. 3) of the CCD serial memory 11 (see FIG. 1) have been supplying the DATA OUT signals, the computer causes the $\overline{\text{MEMRQ}}$ signal to go high when each of the counters 16 (see FIG. 2), 26, and 27 is at a count of zero after the counter 14 has advanced to the count of fifteen. When the $\overline{\text{MEMRQ}}$ signal goes high, the START and COUNT signals go down as previously explained.

However, the counter 14 will be advanced to the count of zero from the count of fifteen one-half cycle of the CLOCK signal after each of the counters 16, 26, and 27 is at a count of zero. Thus, with the counter 14 being advanced to the count of zero when the CLOCK signal goes down after each of the counters 16, 26, and 27 is at a count of zero, a MATCH signal is produced from the comparator 15. However, the MEMRQ signal has gone down when the CLOCK signal, which causes the counter 14 to advance by a count of one when it goes negative, went up. Therefore, the MEMRQ signal is down one-half of a CLOCK signal cycle prior to the MATCH signal going up.

With the MEMRQ signal to the AND gate 70 going down before the MATCH signal can go up, the AND gate 70 cannot provide a high DATA OUT signal. Thus, no inadvertent reading occurs.

It should be understood that inadvertent writing is prevented in a similar manner. That is, the MEMRQ signal to the AND gates 50 and 61, for example, goes down before the MATCH signal can go up.

If the blocks 0-7 (see FIG. 3) of another of the CCD serial memories than the CCD serial memory 11 (see FIG. 1) are to provide the next DATA OUT signals, then the counter 14 (see FIG. 2) would again be loaded to a count of zero. At the same time, the address decoder would supply the new address signal for the specific CCD serial memory.

Considering the operation of the present invention, the counter 14 is loaded with a high or low address signal at its D input when the LOAD signal to the LD input goes down. This address signal determines whether the counter 14 is set at the count of zero or eight.

Then, the computer causes the MEMRQ signal to go high to access the memory 10 (see FIG. 1). When the MEMRQ signal goes high, the $\overline{\text{MEMRQ}}$ signal goes low so that one input to the AND gate 58 (see FIG. 2) always is low when the memory 10 (see FIG. 1) is being accessed.

If it is assumed that the blocks 0-7 (see FIG. 3) of the CCD serial memory 11 (see FIG. 1) are to be initially read, then the counter 14 (see FIG. 2) is set to the count of zero. Additionally, the eight bit input to the address decoder causes the SEL0 signal to be high. The $\overline{\text{WRITE}}$ signal also is high since reading of the data in the CCD serial memory 11 (see FIG. 1) is to be obtained.

If the counter 16 (see FIG. 2) is at other than a count of zero, the MATCH signal from the comparator 15 will not go up initially until the counter 16 reaches the count of zero. Even if the MATCH signal from the comparator 15 goes high when the counter 16 reaches the count of zero, there will be no DATA OUT signals from the AND gate 70 (see FIG. 1) unless the START signal also is up. Since the START signal cannot go up until after each of the counters 26 (see FIG. 2) and 27 is at a count of zero, there is no transmission of the DATA OUT signals from the AND gate 70 (see FIG. 1) until the block 0 (see FIG. 3) at location 0 in the CCD serial memory 11 (see FIG. 1) is being accessed. This is because each of the counters 26 (see FIG. 2) and 27 goes to zero only when the block 0 (see FIG. 3) at the 0 location in each of the CCD serial memories (two shown at 11 and 12 in FIG. 1) of the memory 10 is being accessed.

When the count of each of the counters 16 (see FIG. 2), 26, and 27 is at zero, the SET signal from the output of the AND gate 20 goes high as shown in the timing diagram of FIG. 4. One-half cycle of the oscillator later, this high SET signal at the S input of the flip-flop 37 is transferred to the Q output of the flip-flop 37 to cause the START signal to go up. Thus, as shown in FIG. 4, the START signal goes up when the CLOCK signal goes down.

Therefore, with the MATCH signal having gone up when the count of the counter 16 (see FIG. 2) was at zero, the MATCH signal, as shown in FIG. 4, is still up when the START signal goes up. Accordingly, when the block 0 (see FIG. 3) at location 0 in the CCD serial memory 11 (see FIG. 1) is supplying the signal on the output line 54 of the CCD serial memory 11, this can be supplied as the DATA OUT signal during the negative portion of the CLOCK signal, which caused the counter 16 (see FIG. 2) to go to the count of zero.

The COUNT signal from the Q output of the flip-flop 39 goes up when the next of the CLOCK signals from the oscillator goes down. When this CLOCK signal goes up, the count of the counter 16 is advanced to a count of one.

When the COUNT signal from the Q output of the flip-flop 39 goes high, the SET signal on the output of the AND gate 20 is already low because the output of the decoder 18 is no longer high. This is due to the counter 16 having advanced to the count of one.

Thus, the AND gate 41 cannot supply a high as its output during the entire first scan of the CCD serial memory 11 (see FIG. 1). Therefore, the data in all sixty-four of the blocks 0 (see FIG. 3) supply the DATA OUT signals during the first scan because the counter 14 (see FIG. 2) cannot be advanced from a count of zero, which was produced by the address signal at the D input of the counter 14, during this first scan.

After the sixty-four blocks 0 (see FIG. 3) have supplied the DATA OUT signals from the AND gate 70 (see FIG. 1), each of the counters 16 (see FIG. 2), 26, and 27 reaches a count of zero (This is after ten hundred and twenty-four of the CLOCK signals have been produced.). When this occurs, the SET signal from the output of the AND gate 20 again goes high.

With the COUNT signal at the Q output of the flip-flop 39 already being high, all three inputs to the AND gate 41 are high when each of the counters 16, 26, and 27 is at the count of zero and the CLOCK signal goes up. As a result, the count of the counter 14 is advanced from a count of zero to a count of one when the CLOCK signal goes down.

During the next scanning cycle of the CCD serial memory 11 (see FIG. 1), all of the blocks 1 (see FIG. 3) supply the DATA OUT signals from the AND gate 70 (see FIG. 1). This is because the MATCH signal from the comparator 15 (see FIG. 2) goes high each time that the counter 16 is at a count of one.

When the CCD serial memory 11 (see FIG. 1) has again been completely scanned, each of the counters 16 (see FIG. 2), 26, and 27 is again at a count of zero to cause the SET signal from the output of the AND gate 20 to again go high. This results in the counter 14 being advanced to the count of two when the CLOCK signal goes down. Therefore, during the next scan cycle, the MATCH signals from the comparator 15 go high only when the counter 16 is at the count of two so that the blocks 2 (see FIG. 3) are supplying the DATA OUT signals from the AND gate 70 (see FIG. 1) during this scan.

When each of the counters 16 (see FIG. 2), 26, and 27 reaches the count of zero after the counter 14 has advanced to the count of seven, the computer causes the MEMRQ signal to go down and the $\overline{\text{MEMRQ}}$ signal to go up. When the MEMRQ signal goes down, the AND gate 70 can no longer produce a high output. Therefore, after the blocks 7 (see FIG. 3) of the CCD serial memory 11 (see FIG. 1) have provided the DATA OUT signals from the AND gate 70, no further DATA OUT signals can be obtained until an address signal is loaded into the D input of the counter 14 and then the computer causes the MEMRQ signal to again go up.

When the MEMRQ signal goes down and the $\overline{\text{MEMRQ}}$ signal goes up, both the START and COUNT signals go down in sequence one cycle of the CLOCK signals apart. The START signal cannot go down until the SET signal from the output of the AND gate 20 is low after the $\overline{\text{MEMRQ}}$ signal has gone up.

If the DATA OUT signals from the AND gate 70 (see FIG. 1) are to next be obtained from the blocks 8-15 (see FIG. 3) of the CCD serial memory 11 (see FIG. 1), then the address signal to the D input of the counter 14 (see FIG. 2) would be high. The output from the address decoder would not change so that the SEL0 signal would remain up.

If the blocks 0-7 (see FIG. 3) of another of the CCD serial memories other than the CCD serial memory 11 (see FIG. 1) are to provide the next DATA OUT signals from the AND gate 70, then the output from the address decoder would be changed. The address signal to the D input of the counter 14 (see FIG. 2) would again be a low and again be loaded into the counter 14.

After the counter 14 has been loaded again and the address decoder has supplied the desired address for the specific CCD serial memory, then the computer causes the MEMRQ signal to again go high. This results in the START and COUNT signals going high in the same manner as previously described with the initiation being dependent upon each of the counters 16, 26, and 27 being at the count of zero.

Whenever it is desired to write data into one of the CCD serial memories (two shown at 11 and 12 in FIG. 1), it is necessary to cause the WRITE signal to go up whereby the $\overline{\text{WRITE}}$ signal goes down. This signal is supplied from the computer.

It again is necessary to have the address decoder supply the desired high address signal to cause only one of the CCD serial memories to have data written therein. Thus, if the CCD serial memory 11 is to have the data written therein, then the SEL0 signal from the address decoder is high. If the CCD serial memory 12 is to have the data written therein, then the SEL255 signal from the address decoder is high.

As discussed with respect to reading of data, only the blocks 0-7 (see FIG. 3) or the blocks 8-15 can have data written in at any time. Thus, the counter 14 (see FIG. 2) must be set at the count of zero or eight in the same manner as discussed for reading.

If data is to be written into the blocks 0-7 (see FIG. 3) of the CCD serial memory 11 (see FIG. 1), then the SEL0 signal is high. Thus, the MATCH signals from the comparator 15 (see FIG. 2) go high each time that the counter 16 is at a count of zero during the first scan of the CCD serial memory 11 (see FIG. 1).

Writing cannot occur until the START signal is up, and this goes up only one-half cycle of the CLOCK signal after each of the counters 16 (see FIG. 2), 26, and 27 is at the count of zero. This insures that the block 0 (see FIG. 3) at the location 0 is the first block into which the data is written. If the data is to be written into the block 8 at the start, this also would insure that the block 8 at the location 8 would be the first of the blocks 8 to have the data written therein.

The input of the MATCH signal from the comparator 15 (see FIG. 2) to the AND gate 50 (see FIG. 1) causes the DATA IN signal to the AND gate 52 to be supplied through the OR gate 53 to the CCD serial memory 11 for latching therein. When the block 0 (see FIG. 3) is shifted on the next rising edge of one of the CLOCK signals to receive data, the latched DATA IN signal is written therein. The remainder of the write operation is the same as that described for reading.

During writing, the output of the AND gate 56 is low each time that the output of the AND gate 50 is high. This insures that any logical one on the recirculating line 55 is not returned to the CCD serial memory 11 when the block 0 (see FIG. 3), for example, is the block to receive the DATA IN signal as the new data. All of the other blocks have their data recirculated by the line 55 (see FIG. 1) during write because the output of the AND gate 50 is low for all of the other blocks because of the MATCH signal being down.

While the present invention has shown and described only the blocks 0-7 (see FIG. 3) or the blocks 8-15 having data read from or written into during a specific read or write cycle, it should be understood that all of the blocks 0-15 could have data written into or read from during a write or read cycle. This would require the counter 14 (see FIG. 2) to count from 0 to 15 in the same manner as the counter 16 counts from 0 to 15 by the computer not applying the high $\overline{\text{MEMRQ}}$ signal until the counter 14 has advanced to the count of fifteen and to always load the D input of the counter 14 with a logical zero.

Furthermore, any other number of blocks could have the data written into or read from during the same cycle. For example, only four of the blocks 0-15 (see FIG. 3) could have the data written thereinto in any specific cycle. This would necessitate having the counter 14 set at the counts of 0, 4, 8, and 12 and the computer supplying the high $\overline{\text{MEMRQ}}$ signal after the counter 14 has advanced to the counts of 3, 7, 11, and 15 depending on the count at which the counter 14 is set.

While the present invention has been shown and described with the memory 10 (see FIG. 1) being formed by the CCD serial memories (two shown at 11 and 12), it should be understood that any type of dynamic storage means could be employed. For example, a random access memory could form the dynamic storage means. In a random access memory, the clock and data rates are not the same since the clock rate is employed to recharge the storage cell means of the memory and the data rate is used to obtain the data therefrom or write data thereinto. Thus, the rate at which the data would be obtained from a random access memory would be a sub-multiple of the data rate, not the clock rate.

An advantage of this invention is that a relatively low data reading and writing rate is obtained with dynamic storage means of an economical size. Another advantage of this invention is to read data from and write data into a dynamic storage means at a rate less than the fixed clock rate of the dynamic storage means.

While the invention has been particularly shown and described with reference to a preferred embodiment thereof, it will be understood by those skilled in the art that various changes in form and details may be made therein without departing from the spirit and scope of the invention.

What is claimed is:

1. A data conversion system including:
   dynamic storage means having a plurality of storage cell means;
   means to scan data in each of said storage cell means of said dynamic storage means at a first rate;
   and means to read data from each of said storage cell means of said dynamic storage means at a second rate slower than the first rate.

2. The system according to claim 1 including means to write data into each of said storage cell means of said dynamic storage means at the second rate.

3. The system according to claim 2 in which:
   said reading means includes:
      means to select only one of said storage cell means of each group of a plurality of groups in which each group has an equal number of said storage cell means during each complete scan of said storage cell means of said dynamic storage means by said scanning means;
      and means to cause said select means to select a different one of said storage cell means of each group of said storage cell means during each scan by said scanning means;
   and said writing means includes:
      means to select only one of said storage cell means of each group of a plurality of groups in which each group has an equal number of said storage cell means during each complete scan of said storage cell means of said dynamic storage means by said scanning means;
      and means to cause said select means to select a different one of said storage cell means of each group of said storage cell means during each scan by said scanning means.

4. The system according to claim 3 in which the second rate is a sub-multiple of the first rate.

5. The system according to claim 3 in which:
   said storage cell means of each group are serially arranged;
   the groups of said storage cell means are serially arranged;
   and said scanning means scans the data in each of said storage cell means of each group in sequence and each of the groups in sequence during each complete scan.

6. The system according to claim 2 in which the second rate is a sub-multiple of the first rate.

7. The system according to claim 2 including:
   said dynamic storage means is a dynamic shift register;
   means to sequentially recirculate data from each of said storage cell means from the output of said dynamic shift register to the input of said dynamic shift register when said reading means is effective;
   said recirculating means recirculating the data at the first rate;
   said reading means including:
      means to select only one of said storage cell means of each group of a plurality of groups in which each group has an equal number of said storage cell means during each complete scan of said storage cell means of said dynamic shift register by said scanning means;
      and means to cause said select means to select a different one of said storage cell means of each group of said storage cell means during each scan by said scanning means;
   said writing means including:
      means to select only one of said storage cell means of each group of a plurality of groups in which each group has an equal number of said storage cell means during each complete scan of said storage cell means of said dynamic shift register by said scanning means;
      and means to cause said select means to select a different one of said storage cell means of each group of said storage cell means during each scan by said scanning means;
   and said recirculating means sequentially recirculating data from each of said storage cell means from the output of said dynamic shift register to the input of said dynamic shift register when said writing means is effective except for each of the selected storage cell means in which writing of data occurs.

8. The system according to claim 1 in which said reading means includes:
   means to select only one of said storage cell means of each group of a plurality of groups in which each group has an equal number of said storage cell means during each complete scan of said storage cell means of said dynamic storage means by said scanning means;
   and means to cause said select means to select a different one of said storage cell means of each group of said storage cell means during each scan by said scanning means.

9. The system according to claim 8 in which the second rate is a sub-multiple of the first rate.

10. The system according to claim 8 in which:
said storage cell means of each group are serially arranged;
the groups of said storage cell means are serially arranged;
and said scanning means scans the data in each of said storage cell means of each group in sequence and each of the groups in sequence during each complete scan.

11. The system according to claim 1 in which said dynamic storage means is a dynamic shift register.

12. The system according to claim 11 in which said dynamic shift register is a charge coupled device.

13. The system according to claim 11 including:
means to sequentially recirculate data from each of said storage cell means from the output of said dynamic shift register to the input of said dynamic shift register when said reading means is effective;
said recirculating means recirculating the data at the first rate;
and said reading means including:
means to select only one of said storage cell means of each group of a plurality of groups in which each group has an equal number of said storage cell means during each complete scan of said storage cell means of said dynamic shift register by said scanning means;
and means to cause said select means to select a different one of said storage cell means of each group of said storage cell means during each scan by said scanning means.

14. The system according to claim 1 in which the second rate is a sub-multiple of the first rate.

15. A data conversion method for dynamic storage means having a plurality of storage cell means including:
scanning the data in each of the storage cell means at a first rate;
and reading data from each of the storage cell means at a second rate slower than the first rate.

16. The method according to claim 15 including writing data into each of the storage cell means at the second rate.

17. The method according to claim 16 including:
dividing the dynamic storage means into a plurality of groups of storage cell means with each group having the same number of the storage cell means and each storage cell means being accessed at a different time;
reading data from only one of the storage cell means in each group of the storage cell means during each complete scan of the storage cell means;
reading data from a different one of the storage cell means in each group of the storage cell means during each complete scan of the storage cell means;
writing data into only one of the storage cell means in each group of the storage cell means during each complete scan of the storage cell means;
and writing data into a different one of the storage cell means in each group of the storage cell means during each complete scan of the storage cell means.

18. The method according to claim 17 in which the second rate is a sub-multiple of the first rate.

19. The method according to claim 17 including:
serially arranging the storage cell means of each group;
serially arranging the groups of the storage cell means;
and scanning the data in each of the storage cell means of each group in sequence and each of the groups in sequence during each complete scan.

20. The method according to claim 16 in which the second rate is a sub-multiple of the first rate.

21. The method according to claim 10 including:
the dynamic storage means is a dynamic shift register;
dividing the dynamic shift register into a plurality of groups of storage cell means with each group having the same number of the storage cell means and each storage cell means being accessed at a different time;
reading data from only one of the storage cell means in each group of the storage cell means during each complete scan of the storage cell means;
sequentially recirculating data at the first rate from each of the storage cell means from the output of the dynamic shift register to the input of the dynamic shift register when reading data from only one of the storage cell means in each group of the storage cell means during each complete scan of the storage cell means;
reading data from a different one of the storage cell means in each group of the storage cell means during each complete scan of the storage cell means;
writing data into only one of the storage cell means in each group of the storage cell means during each complete scan of the storage cell means;
writing data into a different one of the storage cell means in each group of the storage cell means during each complete scan of the storage cell means;
and sequentially recirculating data at the first rate from each of the storage cell means from the output of the dynamic shift register to the input of the dynamic shift register during writing except for each of the storage cell means into which data is written.

22. The method according to claim 15 including:
dividing the dynamic storage means into a plurality of groups of storage cell means with each group having the same number of the storage cell means and each storage cell means being accessed at a different time;
reading data from only one of the storage cell means in each group of the storage cell means during each complete scan of the storage cell means;
and reading data from a different one of the storage cell means in each group of the storage cell means during each complete scan of the storage cell means.

23. The method according to claim 22 in which the second rate is a sub-multiple of the first rate.

24. The method according to claim 22 including:
serially arranging the storage cell means of each group;
serially arranging the groups of the storage cell means;

and scanning the data in each of the storage cell means of each group in sequence and each of the groups in sequence during each complete scan.

25. The method according to claim 15 in which the dynamic storage means is a dynamic shift register and each complete scan is a circulating loop.

26. The method according to claim 25 in which the dynamic shift register is a charge coupled device.

27. The method according to claim 25 including:
dividing the dynamic shift register into a plurality of groups of storage cell means with each group having the same number of the storage cell means and each storage cell means being accessed at a different time;
reading data from only one of the storage cell means in each group of the storage cell means during each complete scan of the storage cell means;
sequentially recirculating data at the first rate from each of the storage cell means from the output of the dynamic shift register to the input of the dynamic shift register when reading data from only one of the storage cell means in each group of the storage cell means during each complete scan of the storage cell means;
and reading data from a different one of the storage cell means in each group of the storage cell means during each complete scan of the storage cell means.

28. The method according to claim 15 in which the second rate is a sub-multiple of the first rate.

* * * * *